United States Patent
Venkataraman et al.

(10) Patent No.: US 10,193,586 B1
(45) Date of Patent: Jan. 29, 2019

(54) DIRECT CONVERSION RECEIVER WITH CORRECTION FOR SECOND ORDER DISTORTION IN RF MIXER

(71) Applicant: TEXAS INSTRUMENTS INCORPORATED, Dallas, TX (US)

(72) Inventors: Jagannathan Venkataraman, Bangalore (IN); Eeshan Miglani, Chhindwara (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/859,443

(22) Filed: Dec. 30, 2017

(51) Int. Cl.
| | |
|---|---|
| H04B 1/10 | (2006.01) |
| H04B 1/16 | (2006.01) |
| H03D 7/12 | (2006.01) |
| H03F 3/45 | (2006.01) |
| H03K 3/017 | (2006.01) |
| H03M 1/12 | (2006.01) |
| H03F 3/19 | (2006.01) |

(52) U.S. Cl.
CPC ............ H04B 1/16 (2013.01); H03D 7/12 (2013.01); H03F 3/45071 (2013.01); H03K 3/017 (2013.01); *H03F 3/19* (2013.01); *H03F 2200/451* (2013.01); *H03M 1/124* (2013.01)

(58) Field of Classification Search
CPC .......... H04B 1/16; H04B 1/40; H04B 1/1607; H04B 1/1615; H03D 7/12; H03F 3/191; H03F 1/31; H03F 3/45071; H03K 3/015; H03K 3/017; H03K 3/02
See application file for complete search history.

(56) References Cited

U.S. PATENT DOCUMENTS

| | | | |
|---|---|---|---|
| 8,400,224 B1 * | 3/2013 | Au ........................ | H03F 3/191 330/278 |
| 2007/0090877 A1 * | 4/2007 | Bagheri .................. | H03F 1/48 330/254 |
| 2009/0191833 A1 * | 7/2009 | Kaczman ............... | H03F 1/301 455/296 |

* cited by examiner

*Primary Examiner* — Thanh Le
(74) *Attorney, Agent, or Firm* — Andrew Viger; Charles A. Brill; Frank D. Cimino

(57) ABSTRACT

A direct conversion radio frequency receiver comprising: a clock generator to provide a first clock signal and a second clock signal; a first node; a second node; a zero-intermediate frequency (zero-IF) mixer coupled to the first and second nodes, clocked by the first and second clock signals, and comprising a first transimpedance amplifier and a second transimpedance amplifier to provide a direct-conversion voltage; a current injector, coupled to the first and second nodes, configurable to inject into the first and second nodes a common mode current or a differential mode current; and a controller, coupled to the zero-IF mixer and the current injector, to adjust at least one of the first and second transimpedance amplifiers based on the direct-conversion voltage when the current injector is to inject the common mode current.

20 Claims, 3 Drawing Sheets

DIRECT CONVERSION RECEIVER WITH CORRECTION FOR SECOND ORDER DISTORTION IN RF MIXER

BACKGROUND

A direct-conversion receiver converts a radio frequency signal directly to a baseband signal without first converting the radio frequency signal to an intermediate frequency signal. A direct-conversion receiver is also referred to as a zero-IF (or low-IF) receiver. Direct-conversion receivers can be susceptible to second-order intermodulation distortion effects.

SUMMARY

In accordance with aspects of the disclosure, a receiver comprising: a clock generator to provide a first clock signal and a second clock signal; a first node; a second node; a zero-intermediate frequency (zero-IF) mixer coupled to the first and second nodes, clocked by the first and second clock signals, and comprising a first transimpedance amplifier and a second transimpedance amplifier to provide a direct-conversion voltage; a current injector, coupled to the first and second nodes, configurable to inject into the first and second nodes a common mode current or a differential mode current; and a controller, coupled to the zero-IF mixer and the current injector, to adjust at least one of the first and second transimpedance amplifiers based on the direct-conversion voltage when the current injector is to inject the common mode current.

In accordance other aspects of the disclosure, a method comprises: injecting a differential current into a zero-intermediate frequency (zero-IF) mixer, the zero-IF mixer comprising a first transimpedance amplifier and a second transimpedance amplifier, the first and second transimpedance amplifiers to provide a direct-conversion voltage; sampling the direct-conversion voltage to provide a direct-conversion sequence; correlating the direct-conversion sequence with a correlation sequence to provide a correlation result; and adjusting at least one of the first and second transimpedance amplifiers provided the magnitude of the correlation result exceeds a first threshold.

In accordance with other aspects of the disclosure, a receiver comprising: a clock generator to provide a first clock signal and a second clock signal; a first node; a second node; a zero-intermediate frequency (zero-IF) mixer coupled to the first and second nodes, clocked by the first and second clock signals, and comprising a first transimpedance amplifier and a second transimpedance amplifier to provide a direct-conversion voltage; a current injector, coupled to the first and second nodes, configurable to inject into the first and second nodes a common mode current or a differential mode current; and a controller, coupled to the zero-IF mixer and the current injector, to adjust a duty cycle of at least one of the first and second clock signals based on the direct-conversion voltage when the current injector is configured to inject the differential mode current.

BRIEF DESCRIPTION OF THE DRAWINGS

For a detailed description of various examples, reference will now be made to the accompanying drawings in which.

DETAILED DESCRIPTION

A direct-conversion receiver, also referred to as a zero-IF (or low-IF) receiver, can be desirable in many radio frequency (RF) applications where a high level of integration at low cost is desirable. An RF direct-conversion receiver down-converts an RF signal directly to baseband. Non-ideal and mismatched circuit components can lead to unacceptable levels of second-order intermodulation distortion, which can interfere with the desired baseband signal after direct conversion is performed on the received RF signal. This Description is directed to zero-IF designs, although the disclosure is also applicable to direct-conversion low-IF designs in which the input signal is mixed to a low IF (such as within the supported Nyquist region of the converted signal), and then mixed down to baseband digitally, which does not affect IMD2/IIP2 distortion estimation/correction according to this disclosure.

In accordance with disclosed examples, a receiver comprises a current injector, correlators and a controller/estimator, the controller configured to adjust one or more transimpedance amplifiers when the current injector injects a common mode current or to adjust the duty cycle of one or more clock signals when the current injector injects a differential current, and to adjust local oscillator (LO) clock duty cycles. Adjusting the transimpedance amplifiers and the LO duty cycles compensates for non-ideal and mismatched circuit components, and reduces second-order distortion components (IMD2/IIP2). Furthermore, by modulating the injected common mode or differential current, the adjustments to the transimpedance amplifiers or the LO duty cycles may be performed while the receiver is down-converting and demodulating a received RF signal (in background). Effectively, in accordance with this disclosure, distortion correction is accomplished by estimating distortion components with the correlators and the controller after conversion to digital.

Figure 1:
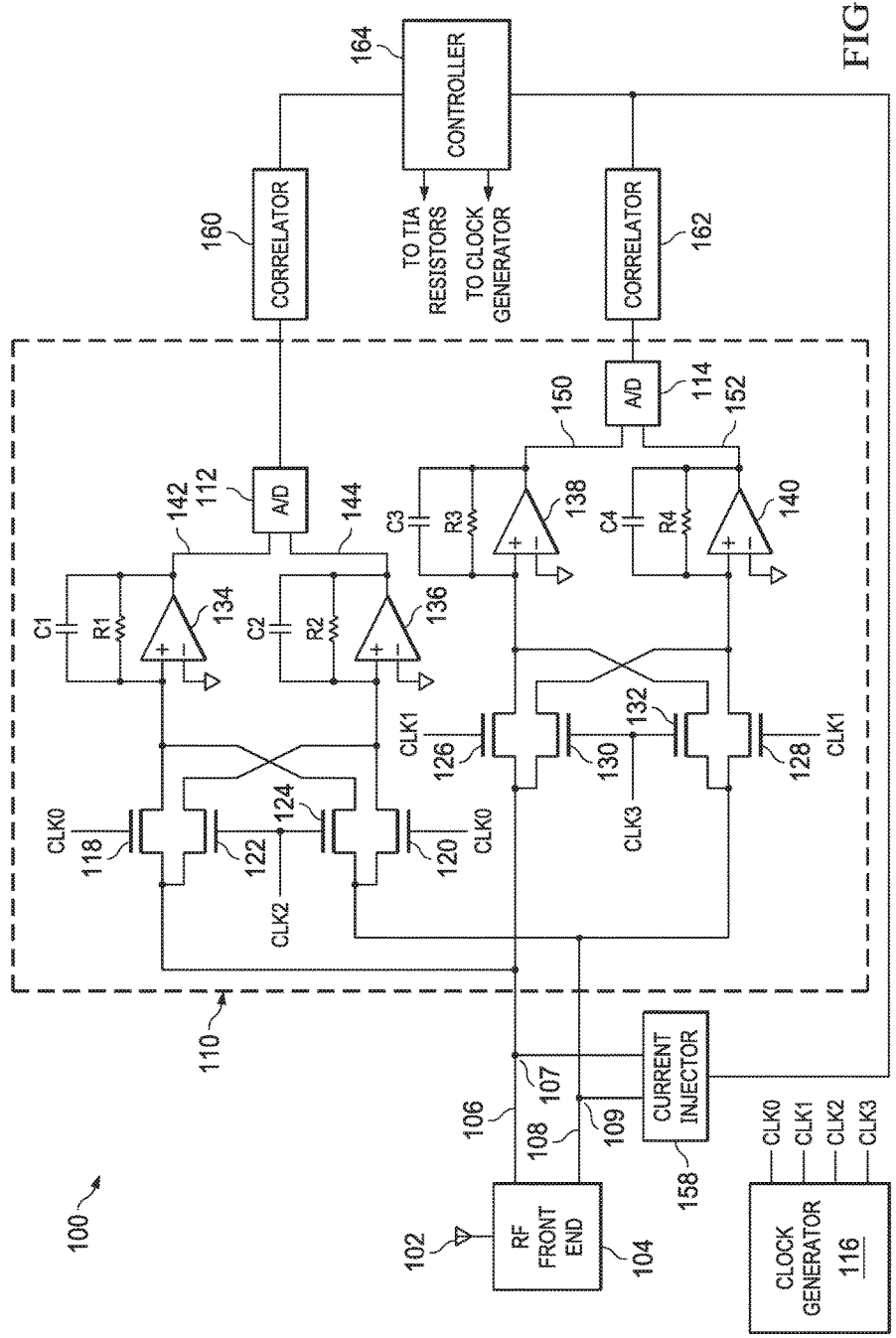
FIG. 1 shows a receiver in accordance with various examples.

FIG. 1 shows an illustrative zero-intermediate frequency (zero-IF) receiver 100. An antenna 102 may receive an RF signal and is coupled to an RF front end 104. The RF front end 104 is coupled to transmission lines 106 and 108, that are coupled to nodes 107 and 109. The RF front end 104 may include several components, such as, for example, a digital step attenuator, a voltage-to-current converter, and a current buffer. The RF front end 104 is configured to excite differential current signals on the transmission lines 106 and 108 in response to RF signals received at the antenna 102.

FIG. 1 represents the transmission line 106 as an interconnect without explicitly showing additional structure for propagating electromagnetic waves on the transmission line 106, such as a ground plane. In some examples, the transmission line 106 may include a strip line. Similar remarks apply to the transmission line 108. RF interference and non-ideal circuit characteristics (non-linearities) may excite an unwanted common mode signal on the transmission lines 106 and 108.

A zero-IF mixer 110 converts an RF signal propagating on the transmission lines 106 and 108 to a baseband signal, where the baseband signal comprises the in-phase and quadrature components of the received RF signal. The mixer 110 converts the received RF signal down to baseband directly, without mixing the received RF signal down to an IF. The zero-IF mixer 110 may also be referred to as a direct-conversion mixer 110, and the illustrative zero-IF receiver 100 may also be referred to as a direct-conversion receiver 100.

After direct conversion, sampling, and digitization, the zero-IF mixer 110 provides the in-phase and quadrature components at the outputs of an analog-to-digital (A/D) converter 112 and an A/D converter 114. Additional circuit modules (not shown in FIG. 1) process the digitized in-phase and quadrature components, such as decoders for error correction, circuits for frame synchronization, and other hardware blocks for implementing communication protocols.

A clock generator 116 provides four clock signals for clocking the zero-IF mixer 110. For some examples, each clock signal has the same period (or frequency), and for some examples each clock signal has a nominal 25% duty cycle. These four clock signals are denoted as CLK0, CLK1, CLK2, and CLK3, where the numeric designation in the name for a clock signal denotes a relative phase. The clock signal CLK1 may lag the clock signal CLK0 by 90°, the clock signal CLK2 may lag the clock signal CLK1 by 90°, and the clock signal CLK3 may lag the clock signal CLK2 by 90°. These relative phase shifts and the 25% duty cycle (for some examples) are nominal values describing the relative relationships among the clock signals, but may not be exact. As will be described further in the examples, the duty cycles for the clock signals can be adjusted. In some examples, the clock signals CLK0, CLK1, CLK2, and CLK3 are generated by a local oscillator.

The clock signal CLK0 clocks a transistor 118 and a transistor 120, the clock signal CLK1 clocks a transistor 126 and a transistor 128, the clock signal CLK2 clocks a transistor 122 and a transistor 124, and the clock signal CLK3 clocks a transistor 130 and a transistor 132.

The transistor 118 when switched ON couples the non-inverting input port of an operational amplifier (opamp) 134 to the node 107. The transistor 120 when switched ON couples the non-inverting input port of an opamp 136 to the node 109. The transistor 122 when switched ON couples the non-inverting input port of the opamp 136 to the node 107. The transistor 124 when switched ON couples the non-inverting input port of the opamp 134 to the node 109.

The transistor 126 when switched ON couples the non-inverting input port of an opamp 138 to the node 107. The transistor 128 when switched ON couples the non-inverting input port of an opamp 140 to the node 109. The transistor 130 when switched ON couples the non-inverting input port of the opamp 140 to the node 107. The transistor 132 when switched ON couples the non-inverting input port of the opamp 138 to the node 109.

Associated with each opamp are a feedback resistor and a capacitor to realize a transimpedance amplifier (TIA). Specifically, associated with the opamp 134 is a resistor r1 and a capacitor c1 coupling an output port 142 of the opamp 134 to its non-inverting input port. The inverting input port of the opamp 134 is grounded. The combination of the opamp 134, the resistor r1, and the capacitor c1 realizes a TIA. The resistance of the resistor r1 determines the gain (in units of resistance) for baseband signals. Similarly, a resistor r2 and a capacitor c2 couples an output port 144 of the opamp 136 to its non-inverting input port. The inverting input port of the opamp 136 is grounded, and the resistance of the resistor r2 determines the gain (in units of resistance) for baseband signals.

The non-inverting input port of the opamp 134 may be referred to as an input port of the TIA comprising the opamp 134, the resistor r1, and the capacitor c1. Similarly, the non-inverting input port of the opamp 136 may be referred to as an input port to the TIA comprising the opamp 136, the resistor r2, and the capacitor c2.

The output ports 142 and 144 are coupled to the A/D converter 112. The A/D converter 112 performs a difference of the voltages developed at the output ports 142 and 144. The A/D converter 112 may provide this difference voltage in the analog domain before sampling and digitizing. With the clock signal CLK0 clocking the transistors 118 and 120, and with the clock signal CLK2 clocking the transistors 122 and 124, each clocked at a frequency $f_C$, the difference voltage provided by the A/D converter 112 is a baseband component of the RF signal received at the antenna 102 having a carrier frequency $f_C$. Without loss of generality, the difference voltage developed at the A/D converter 112 may be referred to as the in-phase voltage or in-phase component of the received RF signal. The A/D converter 112 samples and digitizes the in-phase voltage to provide a sequence of digital values representing the in-phase component. This sequence of digital values may be referred to as an in-phase sequence.

Associated with the opamp 138 is a resistor r3 and a capacitor c3 coupling an output port 150 of the opamp 138 to its non-inverting input port. The inverting input port of the opamp 138 is grounded. The combination of the opamp 138, the resistor r3, and the capacitor c3 realizes a TIA. The resistance of the resistor r3 determines the gain (in units of resistance) for baseband signals. Similarly, a resistor r4 and a capacitor c4 couples an output port 152 of the opamp 140 to its non-inverting input port. The inverting input port of the opamp 140 is grounded, and the resistance of the resistor r4 determines the gain (in units of resistance) for baseband signals.

The non-inverting input port of the opamp 138 may be referred to as an input port of the TIA comprising the opamp 138, the resistor r3, and the capacitor c3. Similarly, the non-inverting input port of the opamp 140 may be referred to as an input port to the TIA comprising the opamp 140, the resistor r4, and the capacitor c4.

The output ports 150 and 152 are coupled to the A/D converter 114. The A/D converter 114 performs a difference of the voltages developed at the output ports 150 and 152. The A/D converter 114 may provide this difference voltage in the analog domain before sampling and digitizing. With the clock signal CLK1 clocking the transistors 126 and 128, and with the clock signal CLK3 clocking the transistors 130 and 132, each clocked at the frequency $f_C$, the difference voltage provided by the A/D converter 114 is a baseband component of the RF signal received at the antenna 102 having a carrier frequency $f_C$. Without loss of generality, the difference voltage developed at the A/D converter 114 may be referred to as the quadrature voltage or quadrature component of the received RF signal. The A/D converter 114 samples and digitizes the quadrature voltage to provide a sequence of digital values representing the quadrature component. This sequence of digital values may be referred to as a quadrature sequence.

Either of the in-phase voltage or the quadrature voltage may be referred to as a direct-conversion voltage, and either of the in-phase sequence or the quadrature sequence may be referred to as a direct-conversion sequence. In this way, when referring to a direct-conversion voltage or a direct-conversion sequence, the description of examples is applicable to either branch of the zero-IF mixer 110 providing the in-phase voltage or the quadrature voltage.

Zero-IF receivers can suffer from second-order intermodulation distortion (IMD2). This distortion may arise from multiple sources in a receiver signal chain, such as, for example, asymmetry (non-linearities) in the components of a zero-IF mixer that provide the direct-conversion voltage. For example, referring to the in-phase component branch of the zero-IF mixer 110 that provides the in-phase voltage, a mismatch in TIA gain (where a first TIA comprises the opamp 134, the resistor r1, and the capacitor c1, and a second TIA comprises the opamp 136, the resistor r2, and the capacitor c2), or a mismatch in the clocking of the transistors 118 and 120 versus the transistors 122 and 124, can lead to second-order distortion components. In some cases, it is desirable for a zero-IF receiver to achieve an input second-order intercept point (IIP2) greater than 60 dBm. To reduce the effects of second-order distortion components due to asymmetry in the zero-IF mixer 110, illustrative examples employ a current injector 158, a correlator 160, a correlator 162, and a controller 164.

The controller 164 programs (or controls) the current injector 158 to inject a differential current into the nodes 107 and 109, or a common mode current into the nodes 107 and 109. The current injected into the nodes 107 and 109, whether differential or common mode, may be non-time varying over some period of time, a low frequency baseband signal, or modulated by a pseudorandom sequence (such as pseudorandom binary or PRBS). A correlator correlates a direct-conversion sequence with a correlation sequence to provide a correlation result to the controller 164. For some examples, based upon the correlation result, the controller 164 adjusts one or more duty cycles of one or more clock signals when the current injector 158 is injecting a differential current. For some examples, based upon the correlation result, the controller 164 adjusts the gain or gains of at least one of the TIAs when the current injector 158 is injecting a common mode current.

Figure 2:
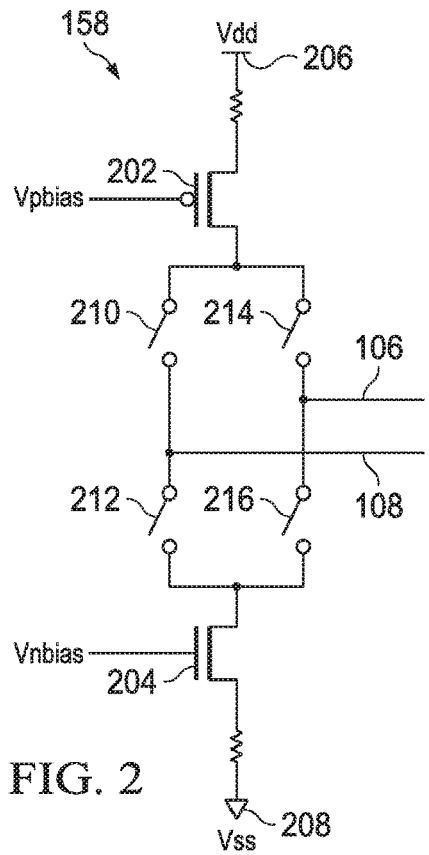
FIG. 2 shows a current injector in accordance with various examples.

FIG. 2 shows an illustrative current injector 158. A p-channel metal oxide semiconductor field effect transistor (pMOSFET) 202 is biased at a gate voltage Vpbias, and an n-channel metal oxide semiconductor field effect transistor (nMOSFET) 204 is biased at a gate voltage Vnbias, so that the transistors 202 and 204 when conducting provide a drain-source current from a power rail 206 at a supply voltage of Vdd to a ground 208 at a ground or substrate voltage Vss. The resistors shown in the path of the drain-source current limit the differential or common mode current provided to the nodes 107 and 109. The state of switches 210, 212, 214, and 216 determine whether a differential current or a common mode current is injected into the nodes 107 and 109. The switches 210, 212, 214, and 216 may comprise pMOSFETs, nMOSFETs, or combinations thereof to realize transmission gates.

When the controller 164 programs the current injector 158 such that the switches 210 and 216 are closed and the switches 212 and 214 are open, a differential current is injected into the nodes 107 and 109. A differential current of opposite direction may be injected into the nodes 107 and 109 by opening the switches 210 and 216 and closing the switches 212 and 214. Maintaining the state of the switches over a period of time provides a static differential current.

In some examples, the state of the switches may be time-varying, where for example for a first state the switches 210 and 216 are closed and the switches 212 and 214 are open, and for a second state the switches 210 and 216 are open and the switches 212 and 214 are closed, implementing a 1-bit DAC. The state of the switches may vary among the first state and the second state in periodic fashion so that for some examples a low-frequency differential current is injected into the nodes 107 and 109. In some examples, the state of the switches may be varied among the first and second states over relatively short time intervals according to a pseudorandom binary sequence, so that a relatively high frequency differential current is injected into the nodes 107 and 109.

When the controller 164 programs the current injector 158 such that the switches 210 and 214 are closed and the switches 212 and 216 are open, a common mode current is injected into the nodes 107 and 109. A common mode current of opposite direction may be injected into the nodes 107 and 109 by opening the switches 210 and 214 and closing the switches 212 and 216. Maintaining the state of the switches over a period of time provides a static common mode current.

In some examples, the state of the switches may be time varying, where for example for a third state the switches 210 and 214 are closed and the switches 212 and 216 are open, and for a fourth state the switches 210 and 214 are open and the switches 212 and 216 are closed. The state of the switches may vary among the third state and the fourth state in periodic fashion so that for some examples a low-frequency common mode current is injected into the nodes 107 and 109. In some examples, the state of the switches may be varied among the third and fourth states over relatively small time intervals according to a pseudorandom binary sequence, so that a relatively high frequency common mode current is injected into the nodes 107 and 109.

Consider a first set of cases (such as power-up calibration) in which the RF front end 104 is put into a state so as not to excite the transmission lines 106 and 108. That is, where the illustrative receiver 100 is put into a state so as not to receive and demodulate RF signals received at the antenna 102.

In a first such case, the controller 164 programs the current injector 158 such that a static common mode current is injected into the nodes 107 and 109. If the zero-IF mixer 110 were ideal such that there were no distortion components, then the direct-conversion voltage provided by either branch (e.g., the in-phase branch or the quadrature branch) of the zero-IF mixer 110 would be zero. However, if the TIA gains are not matched for a branch, then the direct-conversion voltage for that branch is not zero. A correlator performs an average of the direct-conversion voltage over some period of time, and the correlator, or a controller, compares the magnitude of the average to a threshold. If the magnitude exceeds the threshold, then one or more TIA gains in the branch of the zero-IF mixer 110 under consideration are adjusted to reduce the magnitude. This process is repeated, until the magnitude is less than the threshold, or a specific number of passes through the process loop have been attempted. The magnitude of the threshold is a matter of circuit design.

To perform averaging, a correlator correlates a direct-conversion sequence with a correlation sequence including constant values. For example, the correlator 160 may correlate the in-phase sequence provided by the A/D converter 112 with a correlation sequence consisting of all 1's, followed by appropriate scaling, to provide an average of the in-phase sequence over a time interval. The scaling may be performed by the correlator 160 or the controller 164, or absorbed into the definition of the threshold used for comparison.

The gain of a TIA may be adjusted by changing the value of its corresponding feedback resistor. For example, increasing the resistance of the resistor r1 increases the magnitude of the gain of the TIA comprising the opamp 134, and decreasing the resistance of the resistor r1 decreases the magnitude of the gain. If an adjustment is to be made for the in-phase branch of the zero-IF mixer 110, the resistor r1 may be adjusted without adjusting the resistor r2, the resistor r2 may be adjusted without adjusting the resistor r1, or both resistors r1 and r2 may be adjusted. Similar remarks apply to the quadrature branch of the zero-IF mixer 110.

The algebraic sign of the average of the direct-conversion voltage for a particular branch of the zero-IF mixer 110 determines whether the resistance of a resistor is increased or decreased, where whether to increase or decrease the resistance as well as the amount of increase or decrease is a matter of circuit design. For example, suppose the common mode current is injected into the nodes 107 and 109 so as to have a direction toward the input ports of the TIAs, and consider the in-phase branch. If an average is performed on the in-phase sequence provided by the A/D converter 112, and if this average is less than zero where its magnitude exceeds a threshold, then for some examples the resistance of the resistor r1 is reduced.

Continuing with the first set of cases in which the RF front end 104 is put into a state so as not to excite the transmission lines 106 and 108, and considering the case where the controller 164 programs the current injector 158 to inject a common mode current into the nodes 107 and 109, suppose the state of the switches in the current injector 158 is varied so that a low-frequency common mode current is injected. In this case, a correlator may use a correlation sequence comprised of a sinusoidal sequence with a frequency equal to the modulation frequency of the common mode current, taking into account the sampling frequency of the A/D converter. If a fast Fourier transform (FFT) engine is available, then the correlation may be performed by taking the value of one of the frequency bins of the FFT engine. In general, the correlation sequence is a set of complex numbers representing a complex sinusoidal sequence, which may be performed by an FFT engine. The direction in which the resistance value of a resistor is changed, that is, whether the resistance value is increased or decreased, depends upon the phase of the complex number of the frequency bin of interest. This is a matter of circuit design.

As a specific example, for some examples, if the injected common mode current has a phase X relative to the beginning of a sampling interval, then the resistance of the resistor r1 is increased provided the correlator 160 outputs a correlation result having a phase (in radians) within $\pi/2$ of X.

Continuing with the first set of cases in which the RF front end 104 is put into a state so as not to excite the transmission lines 106 and 108, consider the case where the controller 164 programs the current injector 158 to inject a static differential current into the nodes 107 and 109. If the zero-IF mixer 110 were ideal, then the direct-conversion voltage provided by either branch (e.g., the in-phase branch or the quadrature branch) of the zero-IF mixer 110 would be zero. However, if the duty cycles of the clock signals are not matched, then the direct-conversion voltage for that branch is not zero.

An average of the direct-conversion voltage over some period of time is performed, for example by correlating with a sequence of 1's, followed by comparing the magnitude of the average to a threshold, where the magnitude or threshold is properly scaled. If the magnitude exceeds the threshold, then one or more duty cycles in the branch of the zero-IF mixer 110 under consideration is adjusted to reduce the magnitude. This process is repeated, until the magnitude is less than the threshold, or until the number of attempts exceeds a specified number.

This threshold may or may not be equal in magnitude to the threshold considered for the previous cases in which a common mode current is injected. As in the previous cases, the magnitude of this threshold is a matter of circuit design. Accordingly, when describing the examples, it is not necessary to distinguish these two thresholds, so that the thresholds used for the common mode current case and the differential current case may be referred to as "threshold."

The direction in which a duty cycle is changed, for example whether the duty cycle of a clock signal is increased or decreased, and the magnitude of the increment, is a matter of circuit design. As an example, consider the in-phase branch of the zero-IF mixer 110, where a differential current is injected so that current into the node 107 is flowing toward the non-inverting input port of the opamp 134. If the average of the in-phase sequence is negative and exceeds in magnitude a threshold, then the duty cycle of the clock signal CLK0 is decreased.

Continuing with the first set of cases in which the RF front end 104 is put into a state so as not to excite the transmission lines 106 and 108, consider the case where the controller 164 programs the current injector 158 to inject a low frequency differential current into the nodes 107 and 109. A correlator uses a correlation sequence comprising a complex sinusoidal having a frequency based upon the modulation frequency of the current injector 158 and the sampling frequency of the direct-conversion voltage. The choice of algebraic sign and amount by which a duty cycle is changed is a matter of circuit design. If an FFT engine is available, then the frequency bin of interest of the FFT engine may be utilized to provide the correlation result.

As a particular example, suppose the current injector 158 is modulated at 10 MHz according to a sinusoid having zero phase at time zero, where an FFT is performed on the direct-conversion sequence. Suppose the sampling frequency of the A/D converter 112 is 3.2 GHz. If a 1024-point FFT is performed, the tone of interest is in bin number 32. If the magnitude of the value at that frequency bin exceeds a threshold and if its phase lies in the first or fourth quadrant, then the duty cycle of CLK0 is reduced.

The particular examples provided above in which a resistance value is increased or decreased, or a duty cycle of a clock signal is increased or decreased, are matters of circuit design as previously discussed. Simulations of a circuit may be performed so that values for the thresholds may be selected and conditions for determining whether a value is increased or decreased may be determined. This determination may depend upon the phase of a correlation result, where the correlation result may be a complex number.

Consider a second set of cases in which the illustrative receiver 100 is operating so as to receive an RF signal, and distortion correction according to the disclosure operates in background. That is, the RF front end 104 is in a state so as to excite the transmission lines 106 and 108. The controller 164 modulates the state of the current injector 158 according to a pseudorandom binary sequence (PRBS). A correlator uses this pseudorandom binary sequence as a correlation sequence to provide a correlation result to the controller 164. If the controller 164 programs the current injector 158 to inject a common mode current, then one or more resistors are adjusted based upon the magnitude of the correlation result as well as its algebraic sign. If the controller 164 programs the current injector 158 to inject a differential current, then one or more clock signal duty cycles are adjusted based upon the magnitude of the correlation result as well as its algebraic sign. In this way, adjusting the zero-IF mixer 110 is performed in background concurrently with directly converting a received RF signal to a baseband signal.

Figure 3:
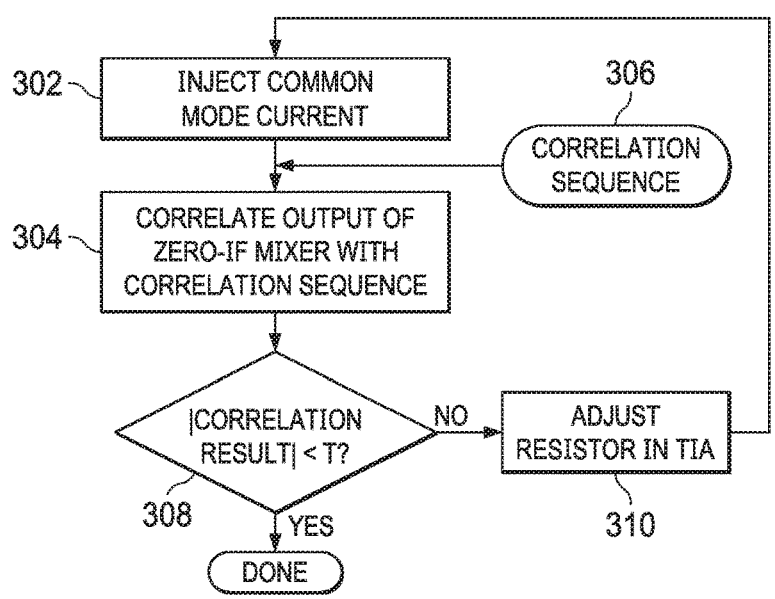
FIG. 3 shows a method in accordance with various examples.

FIG. 3 shows an illustrative method for adjusting a TIA gain for a zero-IF receiver. In step 302, a common mode current is injected into a zero-IF mixer. For example, a common mode current is injected into the nodes 107 and 109 of FIG. 1. In step 304, the output of the zero-IF mixer is correlated with a correlation sequence to provide a correlation result. The correlation sequence generated in step 306 depends upon the modulation, if any, applied to the injected common mode current of step 302. If the injected common mode current is static, then the correlation sequence in step 306 is selected to be a sequence of constant values, such as all ones, to implement an averaging function. For the case in which the injected common mode current is modulated according to a low frequency sinusoid, then the correlation sequence generated in step 306 is a sinusoidal sequence having a frequency that matches the modulation frequency of the injected common mode current. In this case, an FFT engine may be used for steps 304 and 306, where the correlation result is provided by a particular frequency bin of the FFT engine based upon the frequency of modulation of the injected common mode current. If the common mode current is modulated by a pseudorandom binary sequence, then the correlation sequence generated in 306 is the pseudorandom binary sequence.

In step 308, the magnitude of the correlation result provided by step 304 is compared to a threshold. If this magnitude is greater than the threshold, then in step 310 the resistance values of one or more resistors in one or more TIAs are adjusted, and the process again repeats as indicated in step 302. The process may end when the magnitude of the correlation result is less than the threshold, or when the number of iterations of the process illustrated in FIG. 3 exceeds a specified limit.

When the injected common mode current is static or is modulated according to a low-frequency sinusoid, the illustrative receiver 100 of FIG. 1 is put into a state in which it is not receiving RF signals, that is, the RF front end 104 is not exciting the transmission lines 106 and 108, and distortion correction according to the disclosure operates as a calibration phase such as at power-up. When the injected common mode current is modulated according to a pseudorandom binary sequence, the illustrative receiver 100 may be in an operational mode whereby the RF front end 104 is exciting the transmission lines 106 and 108, and distortion correction according to the disclosure operates in background.

Figure 4:
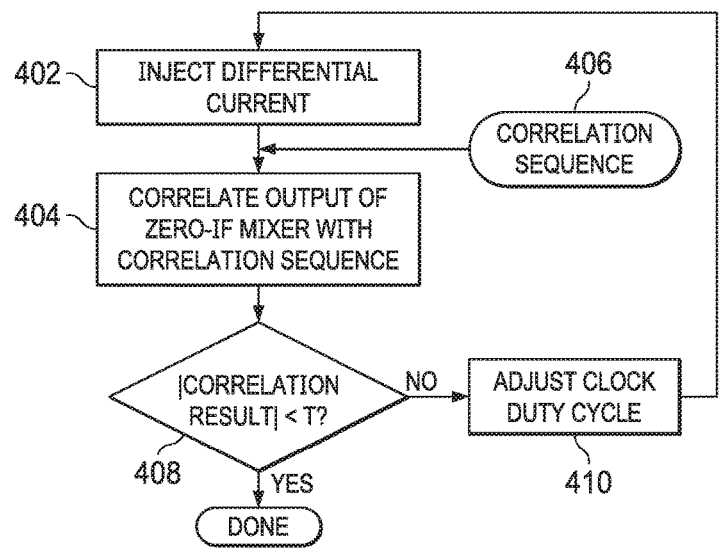
FIG. 4 shows a method in accordance with various examples.

FIG. 4 shows an illustrative method for adjusting a clock signal duty cycle for a zero-IF receiver. In step 402, a differential current is injected into a zero-IF mixer. For example, a differential current is injected into the nodes 107 and 109 of FIG. 1. In step 404, the output of the zero-IF mixer is correlated with a correlation sequence to provide a correlation result. The correlation sequence generated in step 406 depends upon the modulation, if any, applied to the injected differential current of step 402. If the injected differential current is static, then the correlation sequence in step 406 is selected to be a sequence of constant values, such as all ones, to implement an averaging function. For the case in which the injected differential current is modulated according to a low frequency sinusoid, then the correlation sequence generated in step 406 is a sinusoidal sequence having a frequency based upon the modulation frequency of the injected differential current. In this case, an FFT engine may be used for steps 404 and 406, where the correlation result is provided by a particular frequency bin of the FFT engine based upon the frequency of modulation of the injected differential current. If the differential current is modulated by a pseudorandom binary sequence, then the correlation sequence generated in 406 is the pseudorandom binary sequence.

In step 408, the magnitude of the correlation result provided by step 404 is compared to a threshold. If this magnitude is greater than the threshold, then in step 410 the duty cycles of one or more clock signals are adjusted, and the process again repeats as indicated in step 402. The process may end when the magnitude of the correlation result is less than the threshold, or when the number of iterations of the process illustrated in FIG. 4 exceeds a specified limit.

When the injected differential current is static or is modulated according to a low-frequency sinusoid, the illustrative receiver 100 of FIG. 1 is put into a state in which it is not receiving RF signals, that is, the RF front end 104 is not exciting the transmission lines 106 and 108, and distortion correction according to the disclosure operates as a calibration phase such as at power-up. When the injected differential current is modulated according to a pseudorandom binary sequence, the illustrative receiver 100 may be in an operational mode whereby the RF front end 104 is exciting the transmission lines 106 and 108, and distortion correction according to the disclosure operates in background.

For some examples, special-purpose circuits may be fabricated to realize the functions of the controller 164. For some examples, a processor may implement some or all of the functions of the controller 164, where the processor carries out instructions stored as firmware, software, or a combination thereof. For some examples, a field programmable gate array may implement some or all of the functions of the controller 164.

As described previously, for some examples, each clock signal CLK0, CLK1, CLK2, and CLK3 has a nominal 25% duty cycle. For such examples, adjusting each duty cycle to equal 25% reduces second-order distortion components, as will now be described with respect to FIG. 5 and FIG. 6. Duty cycle adjustments can be accomplished, for example, with a current starved delay chain implemented in clock generator 116 controlled by controller 164.

Figure 5:
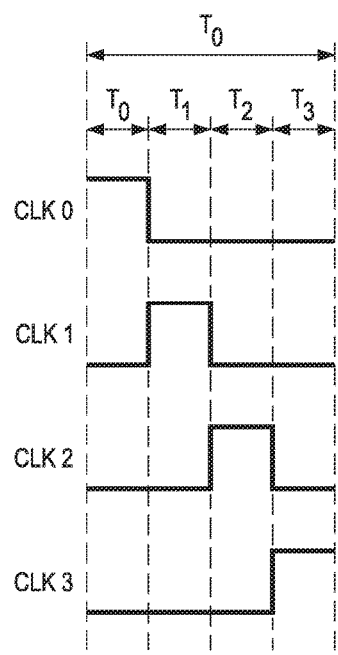
FIG. 5 shows clock signals in accordance with various examples.

FIG. 5 shows one local oscillator period $T_C$ for the four clock signals CLK0, CLK1, CLK2, and CLK3, each with a nominal 25% duty cycle, where without loss of generality the phases are chosen so that the ON component of CLK0 starts at the beginning of the period shown in FIG. 5. The clock signal CLK0 is ON for a time interval $T_0$, the clock signal CLK1 is ON for a time interval $T_1$, the clock signal CLK2 is ON for a time interval $T_2$, and the clock signal CLK3 is ON for a time interval $T_3$. The local oscillator clock period, $T_C$, is $T_C=T_0+T_1+T_2+T_3$, where the local oscillator clock frequency, $f_C$, is $f_C=1/T_C$. Ideally, $T_0=T_1=T_2=T_3$. However, due to non-ideal circuit components, there is some mismatch in these time intervals.

Figure 6:
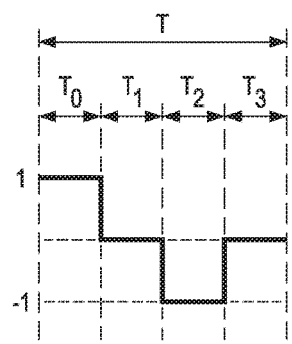
FIG. 6 shows a transimpedance output waveform in the in-phase branch for an injected differential mode current in accordance with various examples.

FIG. 6 shows a transimpedance output waveform in the in-phase branch when a differential mode current is being injected. For example, the waveform in FIG. 6 represents a differential output waveform provided by the output ports 142 and 144 of the opamp 134 of the illustrative zero-IF receiver 100 of FIG. 1. The magnitude of the waveform is normalized to one.

The illustrative zero-IF receiver 100 of FIG. 1, when the current injector 158 is injecting differential mode current, adjusts the clock duty cycles to match each other. By adjusting $T_0=T_2$ in the in-phase branch, the average of the waveform in FIG. 6 over the entire local oscillator clock interval $T_C$ is zero, so that the zero-frequency (DC) component of the waveform is zero.

By adjusting $T_1=T_3$ in the quadrature branch, and by adjusting the clock edges, all time intervals are adjusted to match $\frac{1}{4}T_C$. The average of the waveform in FIG. 6 over the time interval $T_0+T_1$ is zero, and the average of the waveform over the time interval $T_2+T_3$ is zero. But the time interval $T_0+T_1$ and the time interval $T_0+T_1$ each have an effective period of $T_C/2$. Consequently, the frequency component of the waveform at the frequency $2f_C=2/T_C$ is adjusted to be zero. By cancelling out both the DC and $2f_C$ components, second-order intermodulation distortion in the in-phase branch is reduced. Similar remarks are applicable of the quadrature branch. Accordingly, by adjusting the clock signals in both the in-phase and quadrature branches where the clock cycles have a nominal duty cycle of 25%, a zero-IF receiver according to examples reduces second-order intermodulation distortion.

Active circuits at the RF front end 104 generate IMD2 components. Each of the transmission lines 106 and 108 can have second order distortion components, comprising a common second order component and a difference second order component. A common second order component is converted to differential voltages at the outputs of the in-phase or quadrature branches depending upon the mismatches in the resistors in the TIAs. The difference second order component is modulated with the $2f_C$ frequency component of the clock signals, and generates the output voltages at the in-phase and quadrature branches. The $2f_C$ frequency components are created by mismatches in the phases of the clock signals CLK0, CLK1, CLK2, and CLK3, as described below.

In examples with the 25% duty cycle mixer scheme, the mismatches in the time intervals $T_0$, $T_1$, $T_2$, and $T_3$ generate the DC component and the $2f_C$ frequency component in the clock spectrum. The amounts of the DC component and the $2f_C$ frequency component are related. When injecting a low frequency differential current in the transmission lines 106 and 108, an ideal zero-IF mixer would have zero output at the frequency of excitation, provided the time intervals $T_0$, $T_1$, $T_2$, and $T_3$ are matched. But if there is mismatch in these time intervals, then a signal equal to the frequency of excitation appears at the outputs of the in-phase and quadrature branches, and is related to the $T_0$ and $T_3$ mismatch. Accordingly, examples can correct the time intervals $T_0$, $T_1$, $T_2$, and $T_3$ based upon the outputs of the in-phase and quadrature branches to ensure none or little signal excitation.

The above discussion is meant to be illustrative of the principles and various illustrative implementations of the present disclosure. Numerous variations and modifications will become apparent to those skilled in the art once the above disclosure is fully appreciated. It is intended that the following claims be interpreted to embrace all such variations and modifications.

What is claimed is:

1. A receiver comprising:
   a clock generator to provide a first clock signal and a second clock signal;
   a first node;
   a second node;
   a zero-intermediate frequency (zero-IF) mixer coupled to the first and second nodes, clocked by the first and second clock signals, and comprising a first transimpedance amplifier and a second transimpedance amplifier to provide a direct-conversion voltage;
   a current injector, coupled to the first and second nodes, configurable to inject into the first and second nodes a common mode current or a differential mode current; and
   a controller, coupled to the zero-IF mixer and the current injector, to adjust at least one of the first and second transimpedance amplifiers based on the direct-conversion voltage when the current injector is to inject the common mode current.

2. The receiver of claim 1, wherein the controller is coupled to the zero-IF mixer and the current injector to adjust a duty cycle of at least one of the first and second clock signals based on the direct-conversion voltage when the current injector is configured to inject the differential mode current.

3. The receiver of claim 1, further comprising:
   an analog-to-digital converter to sample and convert the direct-conversion voltage to a direct-conversion sequence; and
   a correlator to correlate the direct-conversion sequence with a correlation sequence to provide a correlation result;
   wherein the controller is to adjust at least one of the first and second transimpedance amplifiers provided the magnitude of the correlation result exceeds a first threshold.

4. The receiver of claim 3, wherein the correlator is to average the direct-conversion sequence to provide the correlation result.

5. The receiver of claim 3, wherein the correlator is to perform a discrete Fourier transform on the direct-conversion sequence to provide the correlation result.

6. The receiver of claim 3, wherein the controller is to adjust a duty cycle of at least one of the first and second clock signals provided the magnitude of the correlation result exceeds a second threshold.

7. The receiver of claim 6, wherein the first threshold is equal to the second threshold.

8. The receiver of claim 1, wherein the zero-IF mixer comprises:
   a first transimpedance amplifier comprising an input port, an output port having a first voltage, and a first resistor;
   a first transistor switched ON and OFF by the first clock signal, to couple the first node to the input port of the first transimpedance amplifier when switched ON;
   a second transistor switched ON and OFF by the second clock signal, to couple the second node to the input port of the first transimpedance amplifier when switched ON;
   a second transimpedance amplifier comprising an input port, an output port having a second voltage, and a second resistor;
   a third transistor switched ON and OFF by the second clock signal, to couple the first node to the input port of the second transimpedance amplifier when switched ON;
   a fourth transistor switched ON and OFF by the first clock signal, to couple the second node to the input port of the second transimpedance amplifier when switched ON; and an analog-to-digital converter coupled to the output ports of the first and second transimpedance amplifiers to provide the direct-conversion voltage as a difference of the first and second voltages.

9. The receiver of claim 8, wherein the controller is coupled to the zero-IF mixer and the current injector to adjust a duty cycle of at least one of the first and second clock signals based on the direct-conversion voltage when the current injector is configured to inject the differential mode current.

10. The receiver of claim 8, the analog-to-digital converter to sample and convert the direct-conversion voltage to a direct-conversion sequence, the receiver further comprising a correlator to correlate the direct-conversion sequence with a correlation sequence to provide a correlation result, wherein the controller is to adjust at least one of the first and second transimpedance amplifiers provided the magnitude of the correlation result exceeds a first threshold.

11. The receiver of claim 10, wherein the correlator is to average the direct-conversion sequence to provide the correlation result.

12. The receiver of claim 10, wherein the correlator is to perform a discrete Fourier transform on the direct-conversion sequence to provide the correlation result.

13. The receiver of claim 10, wherein the controller is to adjust a duty cycle of at least one of the first and second clock signals provided the magnitude of the correlation result exceeds a second threshold.

14. The receiver of claim 13, wherein the first threshold is equal to the second threshold.

15. The receiver of claim 1, wherein the direct-conversion voltage is an in-phase voltage.

16. A method comprising:
  injecting a differential current into a zero-intermediate frequency (zero-IF) mixer, the zero-IF mixer comprising a first transimpedance amplifier and a second transimpedance amplifier, the first and second transimpedance amplifiers to provide a direct-conversion voltage;
  sampling the direct-conversion voltage to provide a direct-conversion sequence;
  correlating the direct-conversion sequence with a correlation sequence to provide a correlation result; and
  adjusting at least one of the first and second transimpedance amplifiers provided the magnitude of the correlation result exceeds a first threshold.

17. The method of claim 16, wherein the zero-IF mixer is to be clocked by a first clock signal and a second clock signal, the method further comprising:
  adjusting a duty cycle of at least one of the first and second clock signals provided the magnitude of the correlation result exceeds a second threshold.

18. The method of claim 17, wherein the first threshold is equal to the second threshold.

19. A receiver comprising:
  a clock generator to provide a first clock signal and a second clock signal;
  a first node;
  a second node;
  a zero-intermediate frequency (zero-IF) mixer coupled to the first and second nodes, clocked by the first and second clock signals, and comprising a first transimpedance amplifier and a second transimpedance amplifier to provide a direct-conversion voltage;
  a current injector, coupled to the first and second nodes, configurable to inject into the first and second nodes a common mode current or a differential mode current; and
  a controller, coupled to the zero-IF mixer and the current injector, to adjust a duty cycle of at least one of the first and second clock signals based on the direct-conversion voltage when the current injector is configured to inject the differential mode current.

20. The receiver of claim 19, wherein the controller is to adjust the first and second transimpedance amplifiers based on the direct-conversion voltage when the current injector is configured to inject the common mode current.

* * * * *